(12) United States Patent
Nilsson

(10) Patent No.: US 7,053,727 B2
(45) Date of Patent: *May 30, 2006

(54) TRIMMING OF A TWO POINT PHASE MODULATOR

(75) Inventor: Magnus Nilsson, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 130 days.

This patent is subject to a terminal disclaimer.

(21) Appl. No.: 10/661,902

(22) Filed: Sep. 12, 2003

(65) Prior Publication Data

US 2004/0124938 A1    Jul. 1, 2004

Related U.S. Application Data

(63) Continuation-in-part of application No. 10/655,291, filed on Sep. 4, 2003, now abandoned, which is a continuation-in-part of application No. 10/236,648, filed on Sep. 6, 2002, now Pat. No. 6,700,447.

(60) Provisional application No. 60/478,023, filed on Jun. 11, 2003.

(51) Int. Cl.
    *H03C 3/06* (2006.01)

(52) U.S. Cl. ............... 332/127; 455/260; 331/1 A; 331/8; 331/10; 331/11; 331/15; 331/16; 331/17; 331/18; 331/25; 331/177 V; 331/36 C

(58) Field of Classification Search ........ 330/1 A, 330/8, 10, 11, 15–18, 25, 177 V, 36 C; 332/127; 455/260

See application file for complete search history.

(56) References Cited

U.S. PATENT DOCUMENTS

| | | | |
|---|---|---|---|
| 4,743,867 A | 5/1988 | Smith | |
| 5,207,491 A | 5/1993 | Rottinghaus | |
| 5,386,314 A * | 1/1995 | Jopson | ............... 359/326 |
| 5,483,203 A | 1/1996 | Rottinghaus | |
| 5,834,987 A | 11/1998 | Dent | |
| 5,952,895 A | 9/1999 | McCune, Jr. et al. | |
| 6,229,400 B1 | 5/2001 | McCollough et al. | |
| 6,353,370 B1 | 3/2002 | Cox et al. | |
| 6,366,146 B1 * | 4/2002 | Fredriksson | ............... 327/156 |
| 6,441,690 B1 | 8/2002 | Savelli et al. | |
| 6,621,364 B1 | 9/2003 | Grewing et al. | |
| 2003/0043950 A1 | 3/2003 | Hansen et al. | |
| 2004/0124938 A1* | 7/2004 | Nilsson | ............... 332/112 |
| 2004/0192231 A1* | 9/2004 | Grewing et al. | ............... 455/102 |
| 2004/0192369 A1* | 9/2004 | Nilsson | ............... 455/522 |
| 2005/0104669 A1* | 5/2005 | Herzinger et al. | ............... 331/16 |

FOREIGN PATENT DOCUMENTS

| | | |
|---|---|---|
| DE | 29 41 049 A1 | 10/1979 |
| DE | 3447 118 A1 | 7/1986 |
| EP | 0 408 238 A2 | 1/1991 |
| EP | 0 961 412 A1 | 12/1999 |
| EP | 1 063 766 | 12/2000 |
| EP | 1 079 514 A1 | 2/2001 |
| EP | 1 223 670 A2 | 7/2002 |

(Continued)

Primary Examiner—Michael B Shingleton

(57) ABSTRACT

Method and system are disclosed for automated calibration of the VCO gain in phase modulators. The method and system of the invention comprises synthesizing, in a phase modulator, a signal having a given output frequency using a controlled oscillator having a frequency control input, a modulation input, and a feedback loop. A frequency control signal is applied to the frequency control input, and gain variation of the controlled oscillator is compensated for outside of the feedback loop via the modulation input. The method and system of the invention may be employed in any telecommunication system that uses phase and amplitude modulation, including EDGE and WCDMA systems.

25 Claims, 11 Drawing Sheets

FOREIGN PATENT DOCUMENTS

| GB | 2337 884 A | 12/1999 |
| WO | WO 99/07066 | 2/1999 |
| WO | WO 99/43080 | 8/1999 |
| WO | WO-02/067428 | 8/2002 |

* cited by examiner

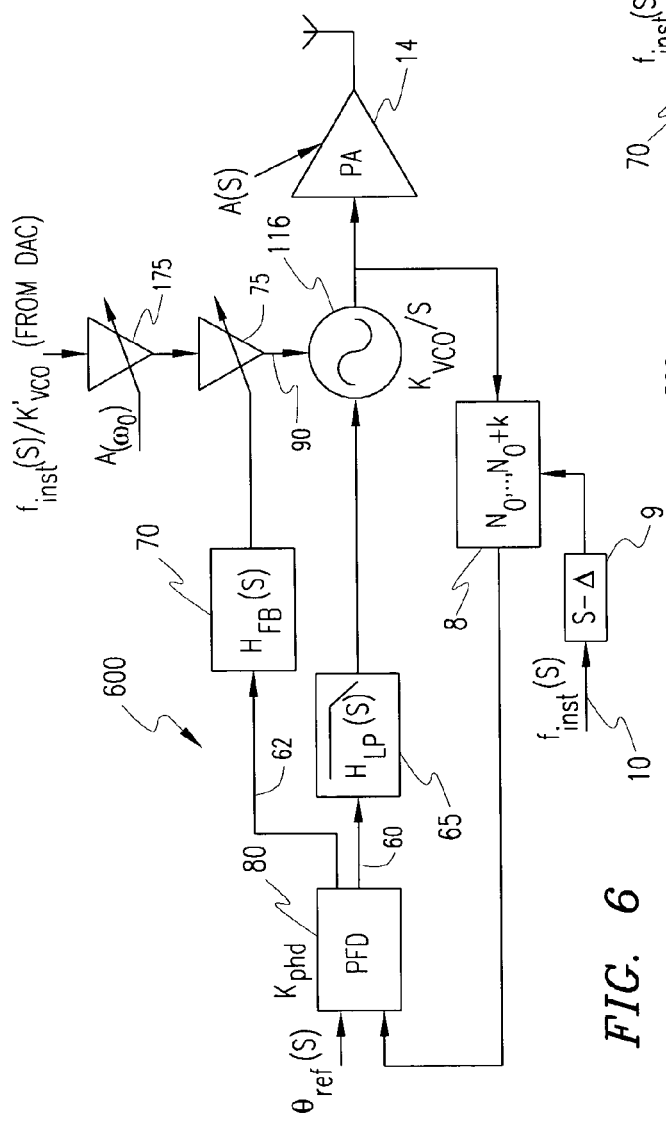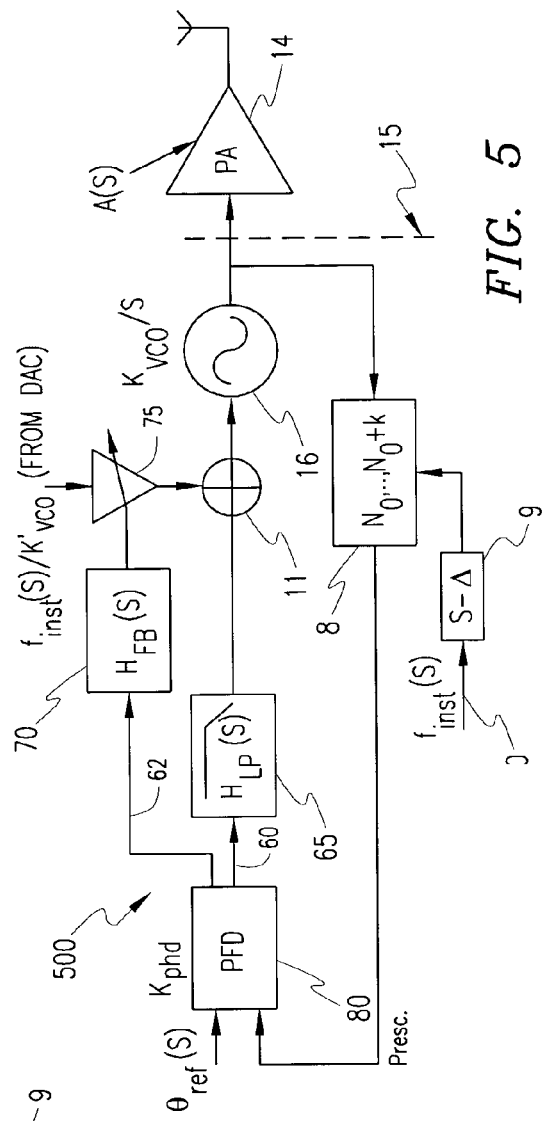
FIG. 6
FIG. 5

TRIMMING OF A TWO POINT PHASE MODULATOR

CROSS REFERENCE TO RELATED APPLICATIONS

This application claims the benefit of U.S. Provisional Application No. 60/478,023, filed Jun. 11, 2003 and is a continuation-in-part of U.S. application Ser. No. 10/655,291, filed Sep. 4, 2003, now abandoned, which is a continuation-in-part of U.S. application Ser. No. 10/236,648, filed Sep. 6, 2002, now U.S. Pat. No. 6,700,447, the disclosure of which are incorporated herein by reference.

FIELD OF THE INVENTION

The invention relates to direct modulation of a radio frequency signal and, in particular, to direct modulation of a radio frequency signal using a two-point phase modulator.

BACKGROUND OF THE INVENTION

All digital, narrowband radio transmitters that are spectrally efficient require, in principle, two operations to be performed: (1) the baseband data must be filtered to limit the width of its spectrum, and (2) the resulting baseband signal must be translated to the desired radio frequency band. A number of techniques exists for translating the baseband signal to the radio frequency signal. One technique involves feeding the baseband signal directly into the inputs of a frequency synthesizer, such as a PLL (phase-locked loop).

Operation of the PLL is well known to persons having ordinary skill in this field and will therefore not be described here. It will suffice to say that the division factor N of the PLL can be either an integer value or it can be a non-integer value, i.e., a fractional-N PLL. Fractional-N PLLs are usually controlled by sigma delta modulators. The sigma delta modulator switches the division factor of the PLL between different integer values such that the resulting average value of the PLL output signal can be made a fractional multiple of its reference signal.

Applying a baseband signal to the sigma delta modulator results in direct modulation of the fractional-N PLL. Typically, a filtered version of the baseband signal is provided to the sigma delta modulator, which then uses the instantaneous frequency of the baseband signal to vary the frequency division factor of the frequency divider. By controlling the frequency division factor with a sigma-delta modulator, modulation with a constant envelope (i.e., frequency and phase modulation) can be generated. And because the sigma delta modulator takes the place of complicated analog circuitry, extremely compact architectures can be developed for constant envelope systems (e.g., Global System for Mobile Communications (GSM) or Digital Communication Systems (DCS)). Currently, a complete radio transmitter may be integrated into a single ASIC (application specific integrated circuit) using the direct modulation approach.

Constant envelope systems are not bandwidth efficient, however, and therefore some proposed systems also use amplitude modulation in addition to phase and frequency modulation. Examples of these systems include EDGE (Enhanced Data GSM Environment) and WCDMA (Wideband Code Division Multiple Access). In these systems, the modulating signal is divided into a phase part and an amplitude part. The phase part is introduced in the fractional-N PLL and the amplitude part is added (effectively multiplied) in a post PLL power amplifier. In this way, switching blocks can be used throughout the complete modulator, which is very power efficient.

When dividing the signal into an amplitude and a phase part, however, the respective bandwidth of the phase and of the amplitude part become much wider than that of the combined signal. And since the amplitude and the phase part are combined in a multiplier after the PLL, stringent requirements are imposed on the dynamic range and bandwidth of the amplitude and phase parts, and also on the timing between the amplitude and phase parts.

One way to get around the PLL loop bandwidth limitation is to add another modulation point to the PLL, hence, the term "two-point modulation." In two-point modulation, a second modulation signal is inserted into the PLL after the loop filter. An example of a two-point phase modulator is shown in FIG. 1. The two-point phase modulator includes a phase frequency detector 25, a loop filter 65 (which is a low-pass (LP) filter), an adder 11, a voltage controlled oscillator (VCO) 16, a frequency divider 8 in the feedback loop, and a sigma delta modulator 9. A post PLL power amplifier 14 is also present for adding the amplitude part. A similar modulation scheme is described in U.S. Pat. No. 5,834,987, entitled "Frequency synthesizer systems and methods for three point modulation with a DC-response," which is incorporated herein by reference.

In operation, the instantaneous frequency $f_{inst}$ of the baseband signal is applied to the PLL 15 at two points: point 10 (at the sigma delta modulator) and point 12 (at the adder). A reference frequency $\theta_{ref}$ is applied to the phase frequency detector 25, and an amplitude part "A" is applied to the power amplifier 14. The transfer function from the modulation inputs to the output of the VCO 16 can be derived as:

$$\theta_{out,VCO}(s) = \frac{f_{inst}(s)}{Ns} \frac{K_{phd} \frac{K_{vco}}{s} H_{LP}(s)}{1 + K_{phd} \frac{K_{vco}}{s} \frac{H_{LP}(s)}{N}} + \quad (1)$$

$$\frac{f_{inst}(s)}{K'_{vco}} \frac{\frac{K_{vco}}{s}}{1 + K_{phd} \frac{K_{vco}}{s} \frac{H_{LP}(s)}{N}}$$

$$= \frac{f_{inst}(s)}{s} \frac{\frac{K_{vco}}{K'_{vco}} + K_{phd} \frac{K_{vco}}{s} \frac{H_{LP}(s)}{N}}{1 + K_{phd} \frac{K_{vco}}{s} \frac{H_{LP}(s)}{N}}$$

$$= [\text{If, } K_{vco} = K'_{vco}] = \frac{f_{inst}(s)}{s}$$

As can be seen, the transfer function for the two-point modulator is independent of the PLL loop bandwidth. This eliminates the trade-off between PLL loop bandwidth and modulation bandwidth. Unfortunately, because the transfer function is dependent on the VCO gain, $K_{vco}$, the scheme results in a new unknown being introduced, namely, the estimation of the VCO gain, $K'_{vco}$. If $K'_{vco}$ is wrong, then spectral growth may result that may compromise the ACPR (adjacent channel power ratio) requirement of the system.

A standard VCO configuration is depicted in FIG. 2. As can be seen, the VCO includes a resonator composed of inductors L1, L2 (20, 22) and varactors $C_v$ (30, 32). Parasitic capacitance $C_{par}$ (24) represents all capacitor loading and all parasitic capacitances as seen from the resonator. Also present is a tuning network composed of coupling capacitors $C_c$ (26, 28) and $R_{gnd}$ (34, 36) (ground reference for the varactors) for coupling the varactors $C_v$ loosely to the resonator. The bottom part of FIG. 2 shows the active components (e.g., transistors 38, 40) responsible for sustaining the oscillation. In a radio frequency (RF) ASIC with an onboard VCO, the VCO gain is dependent on the size of the inductor, the output frequency, and the bias point of the varactor.

The tuning sensitivity (VCO gain) of the VCO is derived by taking the derivative of the VCO center frequency $\omega_o$ with respect to the tuning voltage, as follows:

$$w_o = \frac{1}{\sqrt{L_{tot}C_{tot}}};$$

$$\frac{\partial w_o}{\partial V_{tune}} = \frac{\partial w_o}{\partial C_{tot}} \frac{\partial C_{tot}}{\partial C_V} \frac{\partial C_V}{\partial V_{tune}}$$

$$= -\frac{L_{tot}}{2(L_{tot}C_{tot})^{\frac{3}{2}}} \frac{1}{2}\left(\frac{C_c}{C_c+C_V}\right)^2 \frac{\partial C_V}{\partial V_{tune}}$$

$$= -\frac{L_{tot}w_o^3}{2} \frac{1}{2}\left(\frac{C_c}{C_c+C_V}\right)^2 \frac{\partial C_V}{\partial V_{tune}}$$

(2)

As can be seen from Equation (2), the tuning sensitivity is dependent on many parameters. For example, the VCO on-chip inductors (e.g., L1, L2) is a large metal structure and is inherently stable. The varactor capacitance and the slope of the varactor capacitance are dependent on the tuning voltage $V_{tune}$ (42). The tuning voltage $V_{tune}$, in turn, is dependent on the VCO center frequency. By making a careful design and keeping the above equation in mind, however, the total VCO gain variation can be reduced.

A table with measured VCO gain versus frequency can compensate for variations in the VCO gain. The main problem with this solution, however, is that when manufacturing the circuits, the parasitic capacitance ($C_{par}$) of the resonator varies, and therefore a different tuning voltage is required to get the correct output frequency. The VCO gain may vary as much as 50% from one sample to another. This means that the VCO gain would have to be measured for each VCO chip to get stable performance.

An alternative solution is described in U.S. Pat. No. 5,834,987, which is a modified VCO circuit configuration where the VCO has two separate inputs, one for the PLL tuning voltage and one for the modulation input. This type of circuit configuration is depicted in FIG. 3. As can be seen, the circuit of FIG. 3 is similar to the circuit of FIG. 2 except that a separate tuning input $V_{mod}$ (50) and modulation varactors $C_{V1}$ (30-1, 32-1) are added for modulation. Coupling capacitors $C_{C1}$ (26-1, 28-1), and grounding resistors $R_{gnd1}$ (34-1, 36-1) are also present. The $V_{mod}$ tuning input is similar to the $V_{tune}$ tuning input (42), but has a DC voltage applied to set the operating point of the varactors $C_{V1}$. This allows the modulation varactors $C_{V1}$ to be biased at a suitable DC level. Also, the input bandwidth and tuning sensitivity can be optimized for modulation. If the DC level applied to the varactors $C_{V1}$ is constant, the only thing varying in Equation (2) is the center frequency. In other words, the modified VCO solution is independent of parasitic capacitor variations, since such variations are compensated in the tuning voltage. This means that the VCO gain variation from sample to sample is mainly dependent on spread in the varactor at the specific bias point and spread in the coupling capacitor. But by careful design, the VCO gain variation can be made less than 10% (mainly by choosing large size components).

Although the above described designs have merit, they may not be sufficient for some systems with strict requirements for VCO gain estimation, such as EDGE and WCDMA systems. Moreover, for future systems with more complex modulation schemes (e.g., 16QAM), the requirement of VCO gain estimations will be even higher. Therefore, some kind of automatic calibration or trimming of the VCO gain is needed.

BRIEF SUMMARY OF THE INVENTION

The present invention is directed to a method and system for automated calibration of the VCO gain in phase modulators. The method and system of the invention comprises synthesizing, in a phase modulator, a signal having a given output frequency using a controlled oscillator having a frequency control input, a modulation input, and a feedback loop. A frequency control signal is applied to the frequency control input, and gain variation of the controlled oscillator is compensated for outside of the feedback loop via the modulation input. The method and system of the invention may be employed in any telecommunication system that uses phase and amplitude modulation, including EDGE and WCDMA systems.

In general, in one aspect, the invention is directed to a phase modulator. The phase modulator comprises a phase-locked loop having a phase frequency detector, a low-pass modulation input coupled to the phase frequency detector, a voltage controlled oscillator, and a high-pass modulation input coupled to the voltage controlled oscillator. A trimming circuit is connected between the phase frequency detector and the voltage controlled oscillator. The trimming circuit is configured to receive an error signal from the phase frequency detector and to control a gain of the high-pass modulation input such that the high-pass modulation input and the low-pass modulation input together form an all-pass modulation input to the voltage controlled oscillator.

In general, in another aspect, the invention is directed to a method of a controlling a gain of a voltage controlled oscillator in a phase modulator having a phase-locked loop that includes a phase frequency detector, a low-pass modulation input coupled to the phase frequency detector, the voltage controlled oscillator, a high-pass modulation input coupled to the voltage controlled oscillator, and a trimming circuit. The method comprises the steps of receiving an error signal from the phase frequency detector in the trimming circuit, and controlling a gain of the high-pass modulation input using the trimming circuit and the error signal such that the high-pass modulation input and the low-pass modulation input together form an all-pass modulation input to the voltage controlled oscillator.

In general, in yet another aspect, the invention is directed to a phase-locked loop. The phase-locked loop comprises a phase frequency detector, a voltage controlled oscillator, and a trimming circuit connected between the phase frequency detector and the voltage controlled oscillator. The trimming circuit is configured to receive an error signal from the phase frequency detector and to control a gain of the voltage controlled oscillator based on the error signal and an estimation of the gain of the voltage controlled oscillator.

In general, in still another aspect, the invention is directed to a frequency synthesizer. The frequency synthesizer comprises a voltage controlled oscillator having a tuning input which is responsive to a frequency control input signal to generate an output frequency, and having a feedback loop, and a compensation circuit for compensating gain variation of the controlled oscillator outside of the feedback loop.

It should be emphasized that the term comprises/comprising, when used in this specification, is taken to specify the presence of stated features, integers, steps, or components, but does not preclude the presence or addition of one or more other features, integers, steps, components, or groups thereof.

BRIEF DESCRIPTION OF THE DRAWINGS

A better understanding of the invention may be had by reference to the following detailed description when taken in conjunction with the accompanying drawings, wherein:

FIG. 2, previously described in part, is a simplified schematic of a typical differential, on-chip VCO;

FIG. 3, previously described in part, is a simplified schematic of a modified VCO optimized for modulation;

FIG. 6 is a block diagram of another embodiment of a modulator using two-point phase modulation and feedback for setting the VCO gain estimation according to embodiments of the invention;

DETAILED DESCRIPTION OF PREFERRED EXEMPLARY EMBODIMENTS OF THE INVENTION

Following is a detailed description of embodiments of the invention with reference to the drawings wherein numerals and labels for similar elements are carried forward.

As mentioned previously, certain systems such as EDGE and WCDMA as well as future systems with more complex modulation schemes (for example, 16QAM) require more stringent VCO gain estimations using the modulation scheme described above. Accordingly, the present invention is directed to a method and system for automatic calibration of the VCO gain. Also, using automatic calibration may result in a higher yield on the fabrication side and more stable operation.

Referring again to the modified VCO of FIG. 3, compensation for VCO gain variations can be applied by changing the DC level at the modulation input varactors $C_{V1}$. By applying the VCO gain estimation $K'_{VCO}$ after the digital-to-analog converter (DAC) (not expressly shown), which is used for applying the modulation at the VCO input (i.e., point 12 of FIG. 1), the dynamic range requirement of the DAC is not affected. These general considerations apply for the below-described feedback systems as well.

Figure 1:
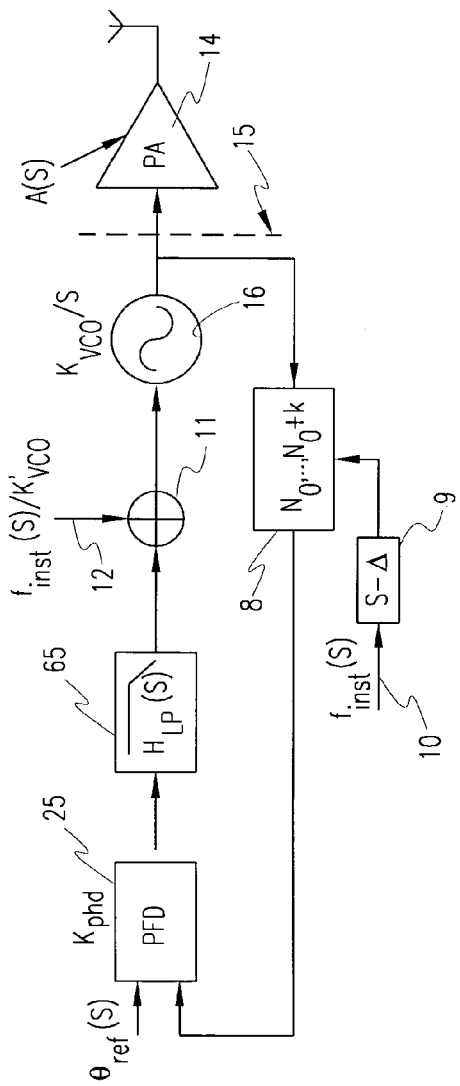
FIG. 1, previously described in part, is a block diagram showing two-point modulation.

Referring back to the two-point modulator of FIG. 1, the modulation signal applied at the VCO input (point 12) causes a change in the VCO output frequency. As a result, a counteracting output is produced by the phase frequency detector 25 to try and correct the VCO output frequency. When the same modulation signal is applied at the pre-scaler (i.e., frequency divider) 8 input, however, the error signal from the phase frequency detector output is zero. The scheme in FIG. 1 results in the following transfer function for the phase frequency detector 25:

$$\theta_{out,PFD}(s) = f_{inst}(s)\frac{K'_{vco} - K_{vco}}{K'_{vco}} \frac{\frac{K_{phd}}{Ns}}{1 + \frac{K_{phd}K_{vco}H_{LP}(s)}{Ns}} \quad (3)$$

Figure 4:
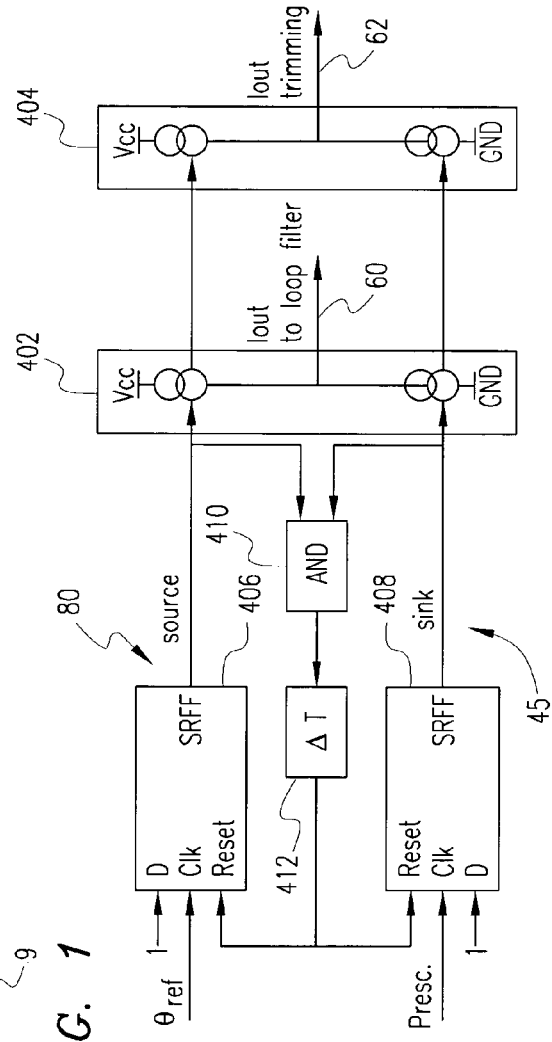
FIG. 4 is a block diagram showing a modified phase frequency detector with an extra charge pump according to embodiments of the invention.

As can be seen from Equation (3), the output from the phase frequency detector can be used to trim the VCO gain estimation. For example, in some embodiments of the invention, an extra charge pump may be added to the phase frequency detector in parallel to the presently existing charge pump. FIG. 4 shows an exemplary implementation of a phase frequency detector 80 according to embodiments of the invention. The phase frequency detector 80 is similar to conventional phase frequency detectors in that the reference signal and the pre-scaler (frequency divider) signal are provided to flip-flops 406 and 408, respectively. The flip-flops 406 and 408 control a charge pump 402, causing it to output a charge proportional to the phase difference between the reference and pre-scaler inputs. An AND-gate 410 is used for resetting the flip-flops and the delay cell 412 is used for deadband compensation.

In accordance with embodiments of the invention, the phase frequency detector 80 includes a second charge pump 404 connected in parallel with the first charge pump 402 as shown. The two charge pumps produce two error signals, namely, output currents 60 and 62, with about the same duty cycle. The first output 60 is used for the PLL loop filter as is commonly done in the art, while the second output 62 provides feedback to the VCO for trimming the VCO gain estimation.

Figure 5:
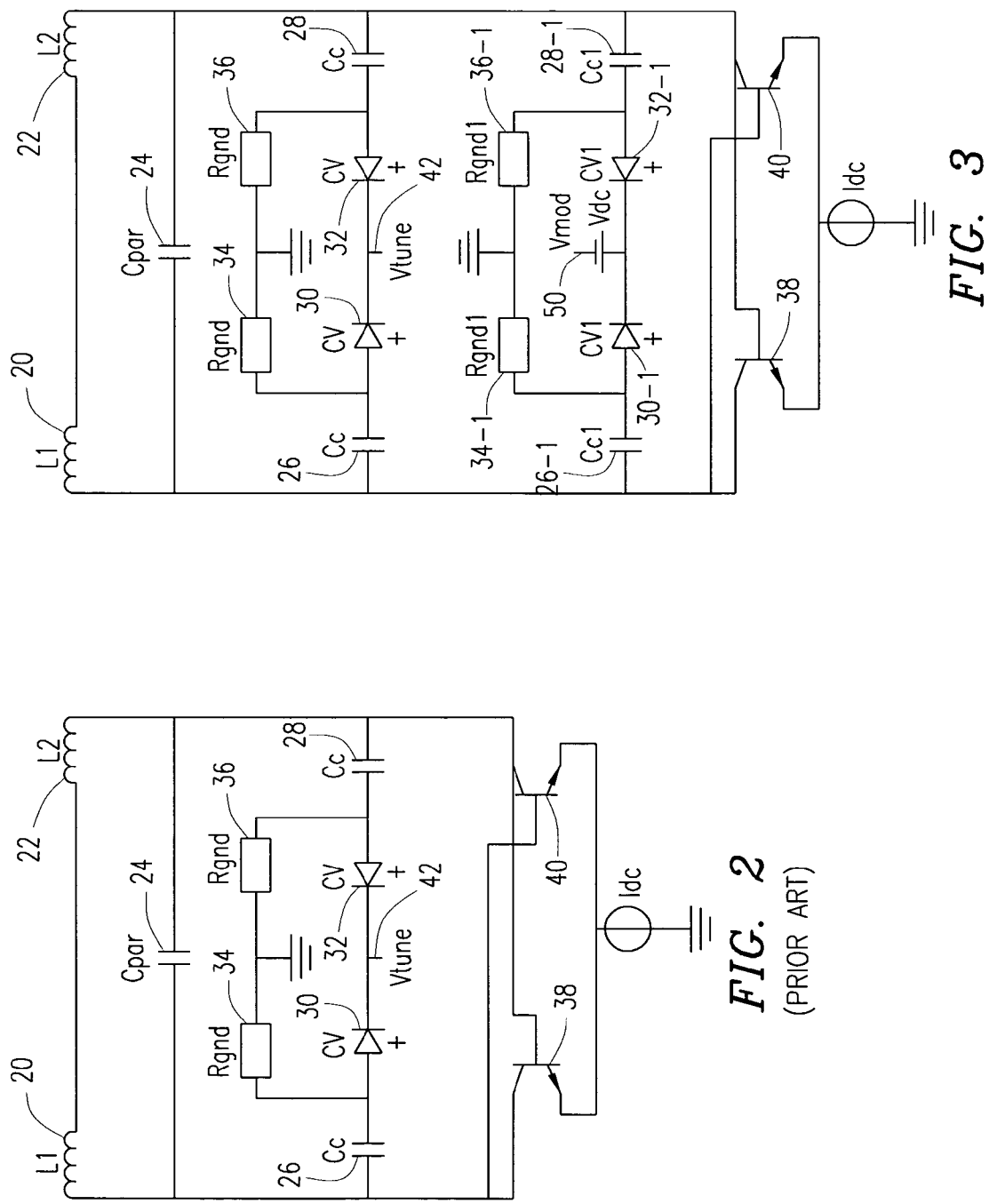
FIG. 5 is a block diagram of a modulator using two-point phase modulation and feedback for setting the VCO gain estimation according to embodiments of the invention.

FIG. 5 illustrates an exemplary two-point phase modulator 500 using the phase frequency detector 80 according to embodiments of the invention. The scheme in FIG. 5 is similar to the scheme in FIG. 4 in that the first error signal 60 is provided to the loop filter 65. The modulator 500 includes a trimming or control loop that comprises a matched filter 70 and a variable gain amplifier 75. The second error signal 62 from the second charge pump 404 is then provided to the matched filter 70, which is used for measuring the modulation error due to VCO gain estimation error and also sets the dynamics of the regulation (e.g., the settling time and the ringing during settling) of the trimming loop. The filter 70 should be able to detect the polarity of the error signal 62 to produce the correction signal. This polarity can be measured by correlating the error signal 62 with the original modulation signal $f_{inst}$.

FIG. 6 illustrates another embodiment of the two-point phase modulator 600 in which compensation for VCO gain variation due to center frequency variations is added. The modulator 600 of FIG. 6 is similar to the modulator 500 of FIG. 5, except that a variable gain amplifier 175 has been added as the input of the second modulation signal. This allows a rough estimation of the VCO gain variation (based on the center frequency $\omega_0$) from the DAC (not expressly shown) to be used, which reduces the gain range of the feedback path. Also, the adder 11 has been removed and a VCO 116 with a separate modulation input 90 has been added. Using this VCO 116, the amplifiers 75 and 175 can be employed to change the DC level applied to the varactors (see FIG. 3). Because the frequency dependent part (see Equation (2)) of the VCO gain variation is known, it may be compensated for outside the feedback loop. Compensating for part of the VCO gain estimation error outside the feedback loop enables a shorter settling time, since the range of the variable amplifier 75 in the control loop may be reduced because the initial error is smaller.

In one exemplary implementation of the above scheme, a small test signal can be applied to the two modulation points. If the VCO gain estimation is correct, there will be no output from the phase frequency detector 80. Otherwise, if the integrated PLL output signal is sampled coherently at the test signal frequency, a DC voltage corresponding to the mismatch results. This voltage can be used to set the gain in the second modulation path including the amplifiers 175, 75. The result is a feedback system for controlling the VCO gain estimation. Some additional filtering (e.g., via the matched filter 70) can be applied to get the correct dynamics in the compensation loop.

The test signal appears at the PLL output and, therefore, has to be chosen low enough not to destroy the adjacent channel power ratio (ACPR) spectra when it is applied outside the transmit channel, or the EVM (error vector magnitude) when the signal is applied inside the transmit channel. The test signal is mixed with the amplitude signal after the PLL (see FIG. 1) so it will not appear as a spur at the modulator output.

Also, when using the dual charge pump solution, the error signal measured represents a high pass (HP) filtered version of the phase error signal. Since the main energy of the error signal is contained in the low frequency (LF) part, this may mean the quality of the error signal is less than optimal.

If the error signal is measured after the loop filter instead, then a low-pass (LP) filtered version of the frequency error results, which may be used for automatic tuning. The error signal then becomes:

$$f_{error}(s) = f_{inst}(s) \frac{K'_{vco} - K_{vco}}{K'_{vco}} \frac{\frac{K_{phd} H_{LP}(s)}{Ns}}{1 + \frac{K_{phd} K_{vco} H_{LP}(s)}{Ns}} \quad (4)$$

Figure 7:
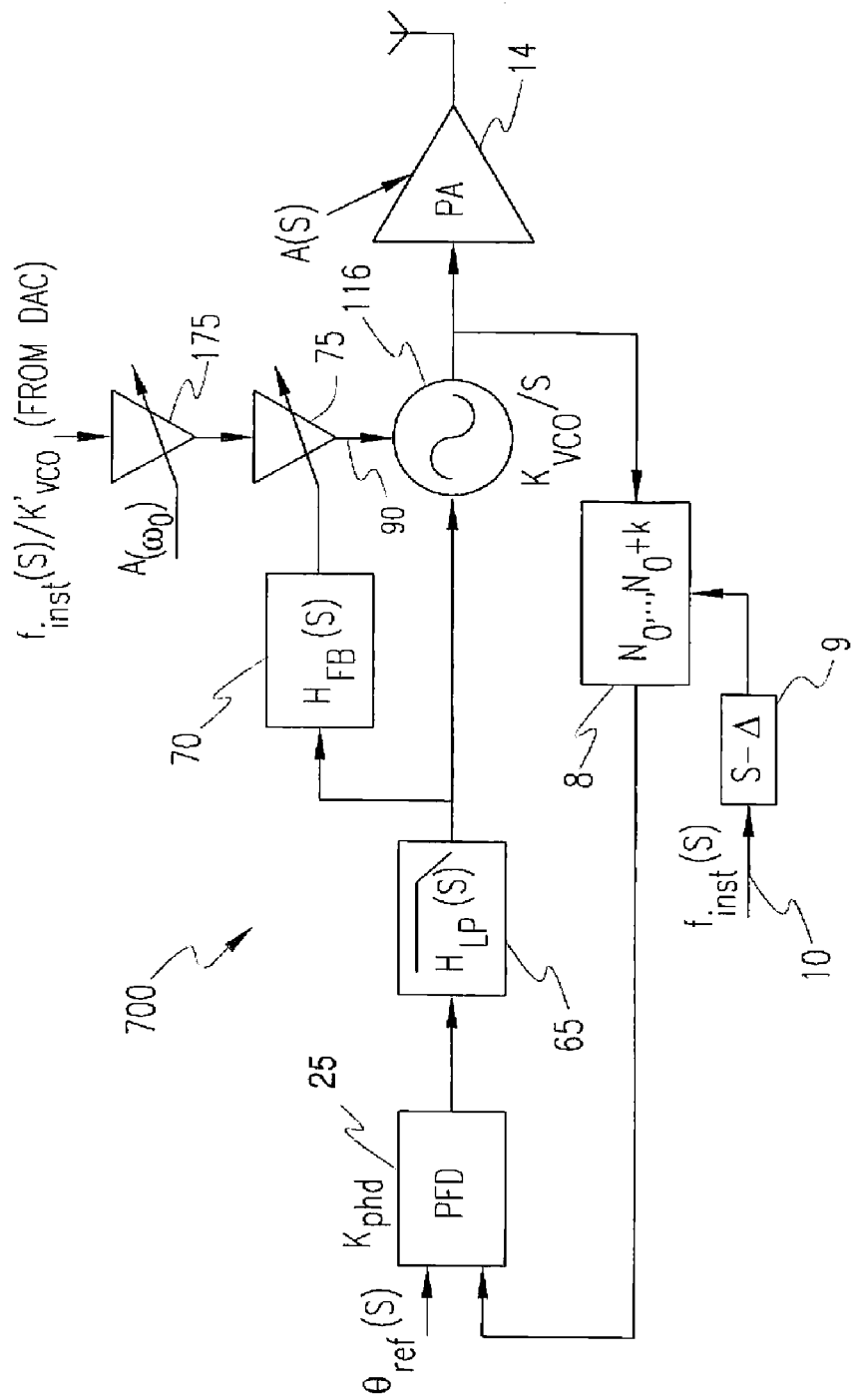
FIG. 7 is a block diagram of a modulator similar to FIG. 6, modified to measure the loop voltage instead of the charge pump output according to embodiments of the invention.

This requires that both frequency insertion points are DC coupled. A block diagram of this solution is presented in FIG. 7. As can be seen, the modulator 700 of FIG. 7 is different from the modulator 600 of FIG. 6 in that the matched filter 70 has been relocated to after the loop filter 65. This allows the loop voltage to be measured and used to control the VCO gain.

Figure 8:
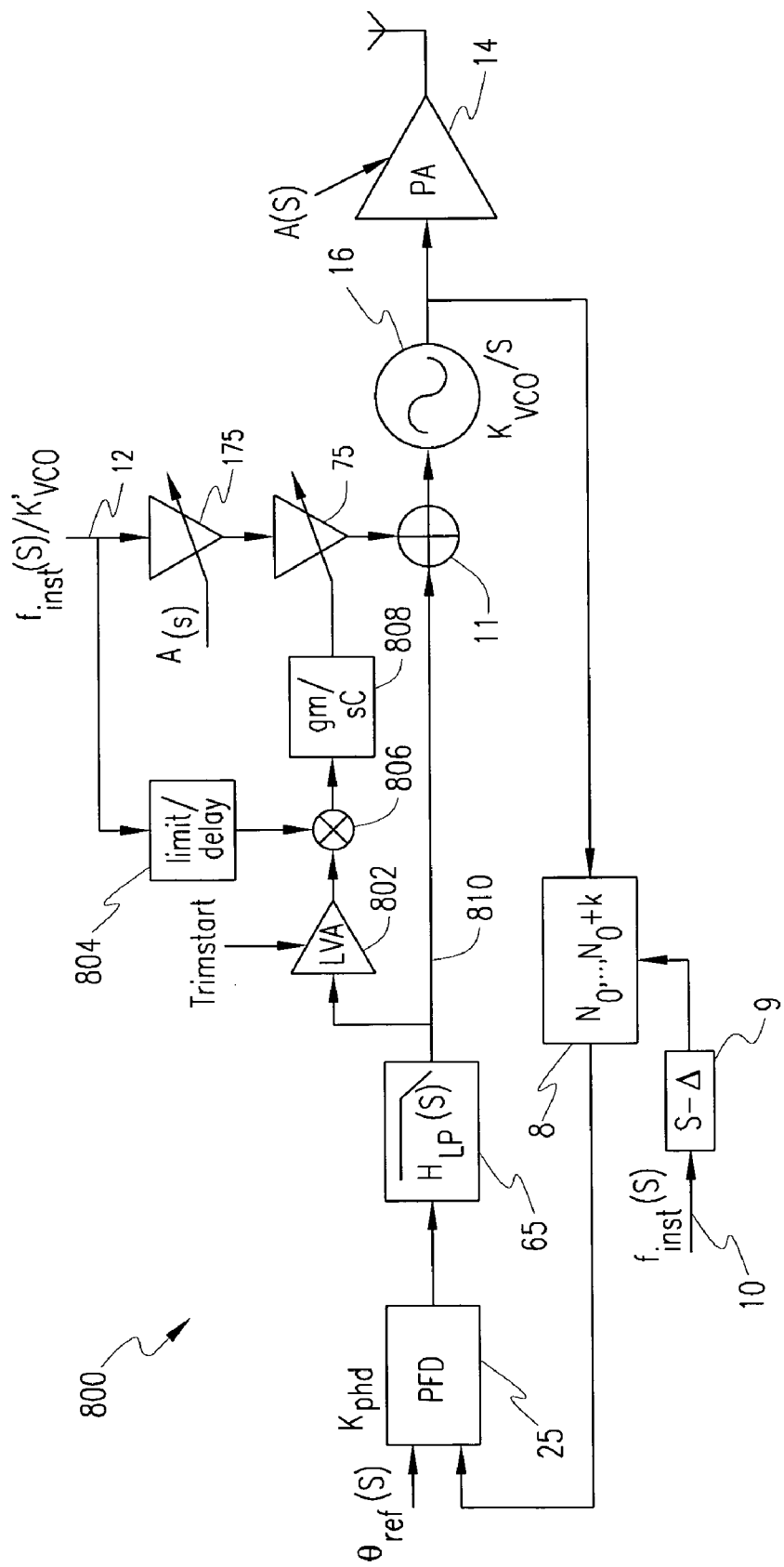
FIG. 8 is a block diagram of another modulator modified to measure the loop voltage instead of the charge pump output according to embodiments of the invention.

FIG. 8 shows another two-point phase modulator 800 which uses the loop voltage to control the VCO gain according to some embodiments of the invention. The two-point phase modulator 800 includes all of the components of the modulator 700 shown in FIG. 7. In addition, the two-point phase modulator 800 also includes a loop voltage amplifier 802, a limit/delay block 804, and a mixer 806. A signal "Trimstart" is used to initiate the gain trimming process and is triggered within a certain amount of time after the PLL begins its phase locking process. To trim the VCO gain, an error signal 810 is measured in the loop after the loop filter 65, but before the adder 11. The error signal 810 is then amplified and filtered by the loop voltage amplifier 802, then mixed in the mixer 806 with a delayed/limited version of the modulation signal. An integrator 808 integrates the mixed signal from the mixer 806, and a variable gain amplifier 75 adjusts the gain of the VCO modulation signal prior to its combination with the error signal 810 via the adder 11. A second variable gain amplifier 175 allows a rough estimation of the VCO gain variation due to the center frequency $\omega_0$ to be used, which reduces the gain range of the feedback path. As mentioned above, the amplifiers 75 and 175 can be used to change the DC level applied to the varactors (see FIG. 3). An exemplary implementation of each of these blocks will now be described.

Figure 9:
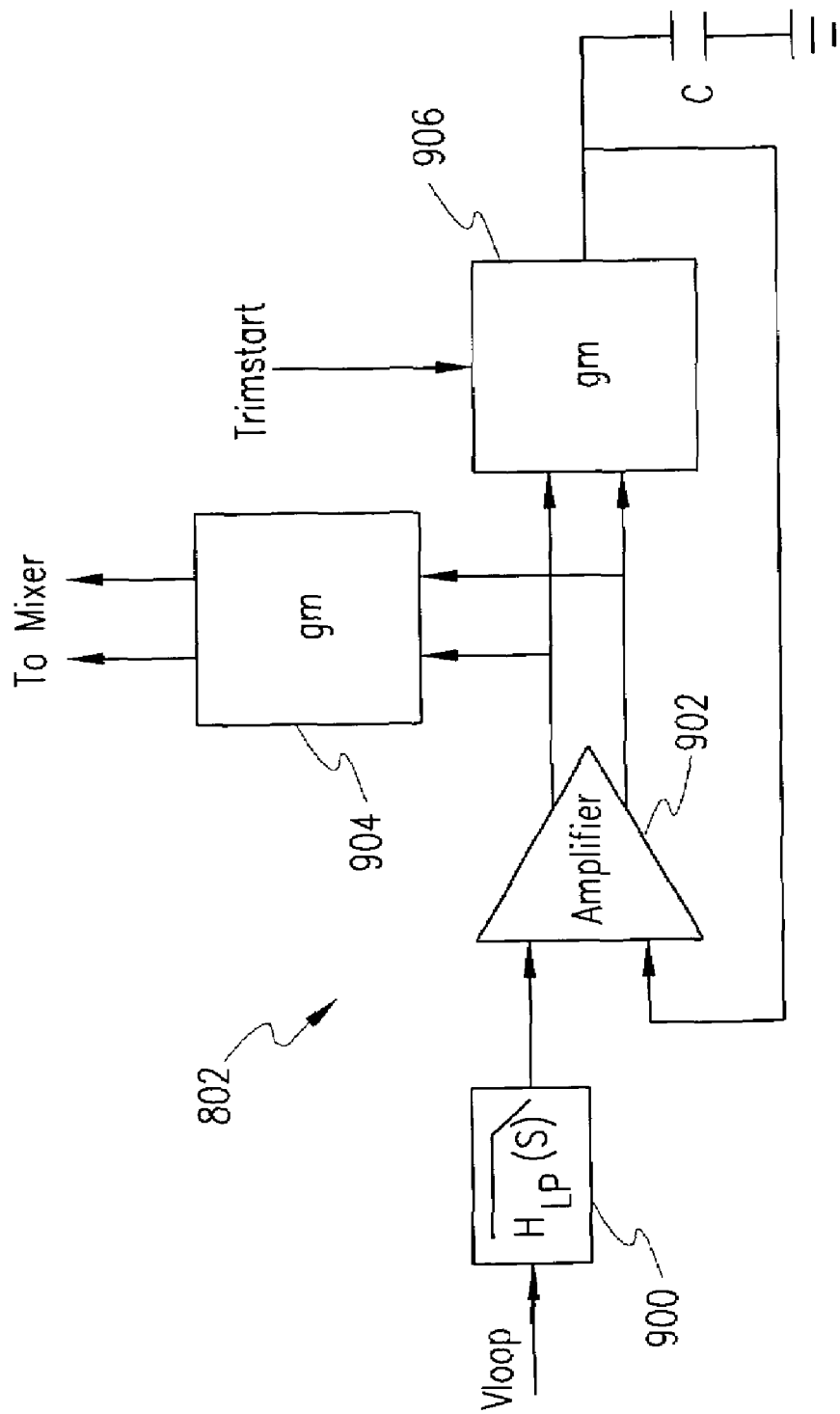
FIG. 9 is a block diagram of an exemplary implementation of a loop voltage amplifier for the modulator of FIG. 8.

FIG. 9 illustrates an exemplary implementation of the loop voltage amplifier 802. The purpose of this amplifier is to amplify the error signal 810 so that it is less constrained by the matching and noise requirements of the subsequent circuitry in the modulator. The error signal 810 is inversely proportional to the VCO gain. Assuming a maximum VCO gain of 60 MHz/V and an average frequency deviation of 60 Hz, the signal level at the VCO input will be about 1 mV. Assuming further that the maximum residual error is about 5 percent, the minimum level for the error signal 810 will be about 50 µV. Since the loop voltage may vary by as much as 2V, depending on the transmitter output frequency and parameters spread, the dynamic range requirement of the modulator becomes greater than 90 dB (20 log(2V/50 µV)=92 dB).

Also, since the loop voltage is a DC component, it may be removed by a high pass filter inserted before the amplifier 902. Mobile telephone systems such as GSM (Global System for Mobile Communication) and EDGE (Enhanced Data GSM Environment), however, are based on TDMA (Time Division Multiple Access), for which there is a transient in the loop voltage for every slot due to the PLL locking. But this may be overcome by implementing a feedback amplifier with a variable high pass cut off frequency. Then, during PLL locking, the cut off frequency is high, and after the PLL is locked, the gain trimming loop is activated by Trimstart, which lowers the high pass filter cut off frequency.

In an exemplary implementation, the PLL locking time may be about 75 µS. The Trimstart signal is triggered after this time using, for example, a counter, to start the gain trimming process. The gain trimming loop settling time may also be on the order of 75 µS, which results in a total calibration time of about 150 µS, a value that is sufficient for GSM/EDGE systems.

In FIG. 9, $V_{loop}$ represents the error signal 810. A low pass filter 900 suppresses any high frequency noise from the error signal 810. Such high frequency noise may result from peaking and group delay ripple at the PLL loop bandwidth. The cut off frequency of the low pass filter should be lower than the PLL loop bandwidth. For example, if the PLL 3 dB loop bandwidth is 150 kHz, the low pass filter cut off frequency should be about 60 kHz.

The output of the low pass filter is provided to a differential amplifier 902. In some embodiments, the differential amplifier 902 has a gain of about 20. The output of the differential amplifier 902 is provided to a transconductance cell 904. For a bipolar transistor, the transconductance is defined as:

$$g_m = \frac{\partial i_c}{\partial v_{be}}, v_{cb} = 0 \quad (5)$$

where $i_c$ is the collector current, $v_{be}$ is the base-emitter voltage, and $v_{cb}$ is the collector-base voltage. The output of the transconductance cell 904 is then provided to the mixer 806.

The output of the differential amplifier 902 is also provided to a second transconductance cell 906. The transconductance value of this cell 906 may be used to set the bandwidth of the amplifier 802 (the amplifier 802 has high pass characteristics that combine with the low pass filter 900 to form a bandpass filter) as follows:

$$V_{FB} = \frac{V_{in}}{1 + s\frac{C}{A \cdot g_m}} \quad (6)$$

Before receiving the Trimstart signal, the transconductance value of the transconductance cell 906 is about 200 µA/V, the capacitance C is about 500 pF, and the differential amplifier gain is about 20, which translates to a 3 dB bandwidth of about 1.3 MHZ. Note that the step response is slew-rate limited in this case, with the slew-rate limit defined as:

$$\frac{\Delta V}{\Delta I} = \frac{I}{C} = \frac{11 \, \mu A}{500 \, pF} = 22 \, kV/s \quad (7)$$

Thus, based on the slew-rate limit, a 1 V step would take about 45 µS.

After the Trimstart signal is received, the transconductance value of the cell 906 becomes 1 µA/V, and the 3 dB bandwidth becomes 60 kHz. Hence, the loop voltage amplifier 802 is now a bandpass amplifier with a bandwidth of about 6–60 kHz.

As for the mixer 806, referring back to FIG. 8, this component is used to correlate the original input signal $f_{inst}$ with the error signal 810 to arrive at the proper sign for the feedback signal. In some embodiments, an ordinary Gilbert mixer may be used to implement the mixer 806.

The limit/delay block 804 allows the mixer 806 to work correctly by compensating for the group delay of the PLL. In some embodiments of the invention, the limit/delay block 804 may be implemented by switching in/out one or more RC networks.

The integrator 808 is used to integrate the output from the mixer 806. The average output signal of the mixer 806 is a voltage corresponding to the error in the VCO gain setting. In some embodiments of the invention, this voltage is converted into a current in a transconductance cell of the integrator 808, then integrated by a capacitor of the integrator 808. The voltage across this capacitor is then used to control the gain of the amplifier 75. In some embodiments, the transconductance of the integrator 808 may be programmable in order to optimize the loop settling time. In any case, since the error signal 810 is inversely proportional to the VCO gain, the transconductance should be proportional to the VCO gain.

Figure 10:
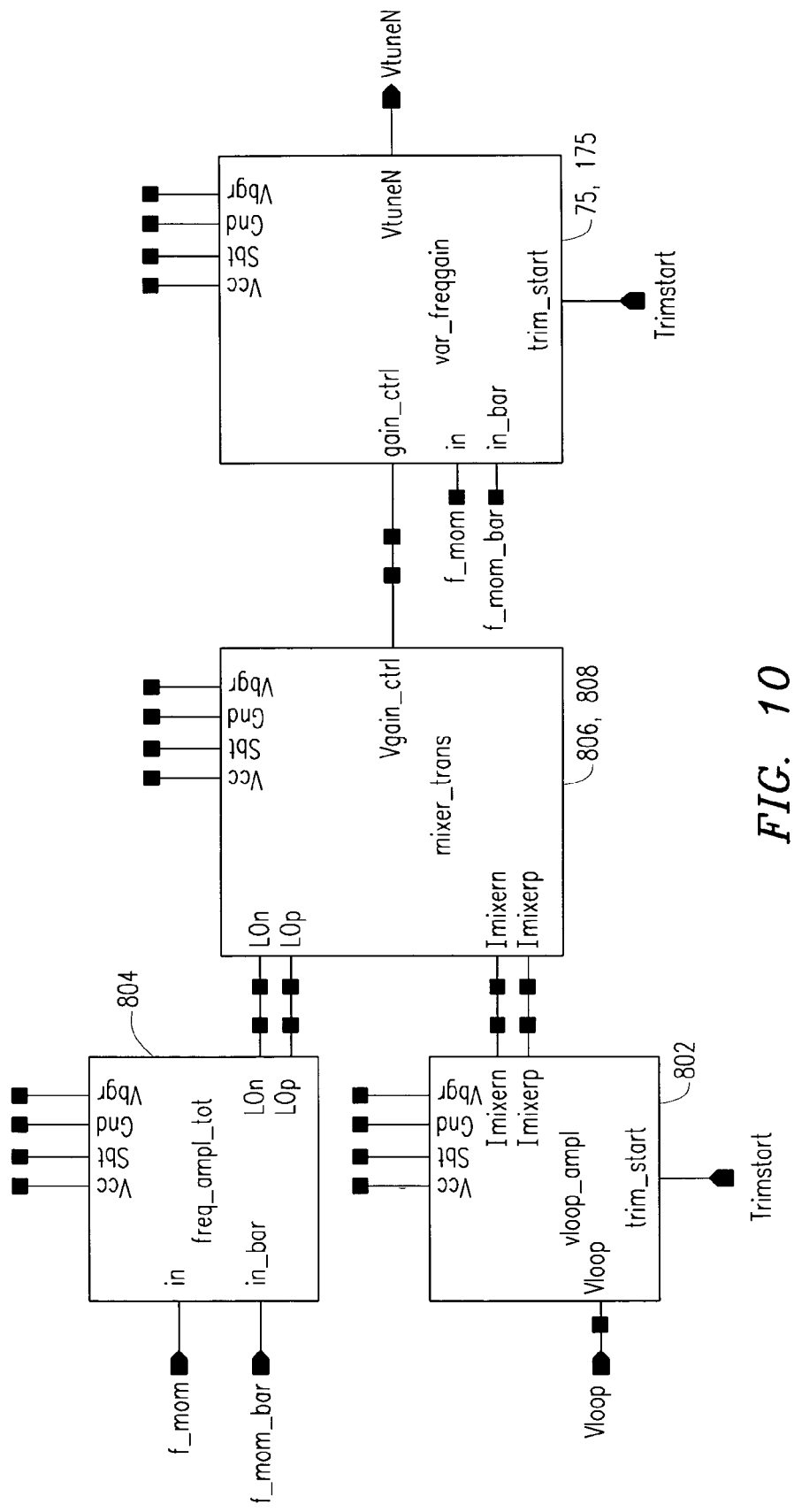
FIG. 10 is a schematic diagram of an exemplary implementation of the VCO trimming loop for the modulator of FIG. 8.

FIG. 10 is a top-level schematic of an exemplary implementation of the VCO trimming loop shown in FIG. 8. In FIG. 10, the lower left portion represents the loop voltage amplifier 802, the upper left portion represents the limit/delay block 804, the middle section represents a combination of the mixer 806 and the transconductance cell 808, and the right portion represents the variable gain amplifiers 75 and 175. The signals labeled "f_mom" and "f_mom_bar" represent the differential versions of $f_{inst}/K'_{VCO}$, and "LOn" "LOp" represent the delayed and limited versions of f_mom and f_mom_bar, respectively. Imixern and Imixerp represent the differential output currents from the differential amplifier 802 that goes into the mixer 806. "Sbt" represents the connection to the on-chip substrate. "Vfb" represents the feedback node in the differential amplifier 802, and "Vbgr" represents a reference voltage from an on-chip band-gap reference that sets the bias point for the entire circuit. "Vcc" and "Gnd" represent the supply voltage and ground, respectively. An exemplary implementation of each of these blocks is described below.

Figure 11:
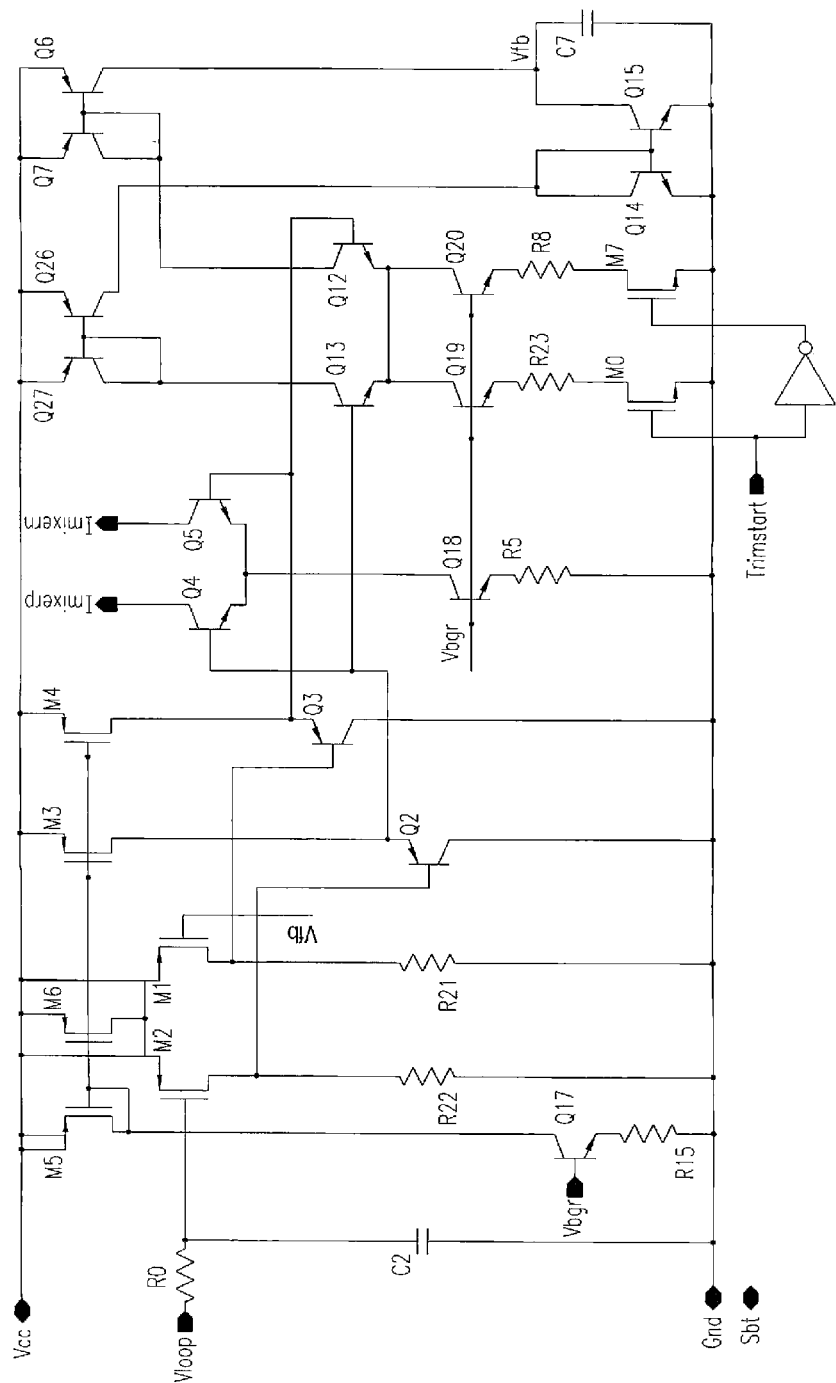
FIG. 11 is a schematic diagram of an exemplary implementation of the loop voltage amplifier shown in FIG. 8.

Referring now to FIG. 11, an exemplary implementation of the loop voltage amplifier 802 of FIG. 9 is shown. In this figure, R0 and C2 provide an exemplary implementation of the low pass filter 900. M1, M2, R21, and R22 provide an exemplary implementation of the differential amplifier 902. Q2 and Q3 are used for voltage level shifting. Q17, R15, and M3–M6 are used to set the DC bias point. Q4 and Q5 provide the transconductance that drives the mixer (DC biased by Q18 and R5). Q12–Q15, Q6, Q7, Q26, and Q27 provide the transconductance that drives the feedback path. C7 is the integrating capacitor. The transconductance is switchable by connecting Q20, R8, M7 or Q19, R23, M0 using the Trimstart signal.

Figure 12:
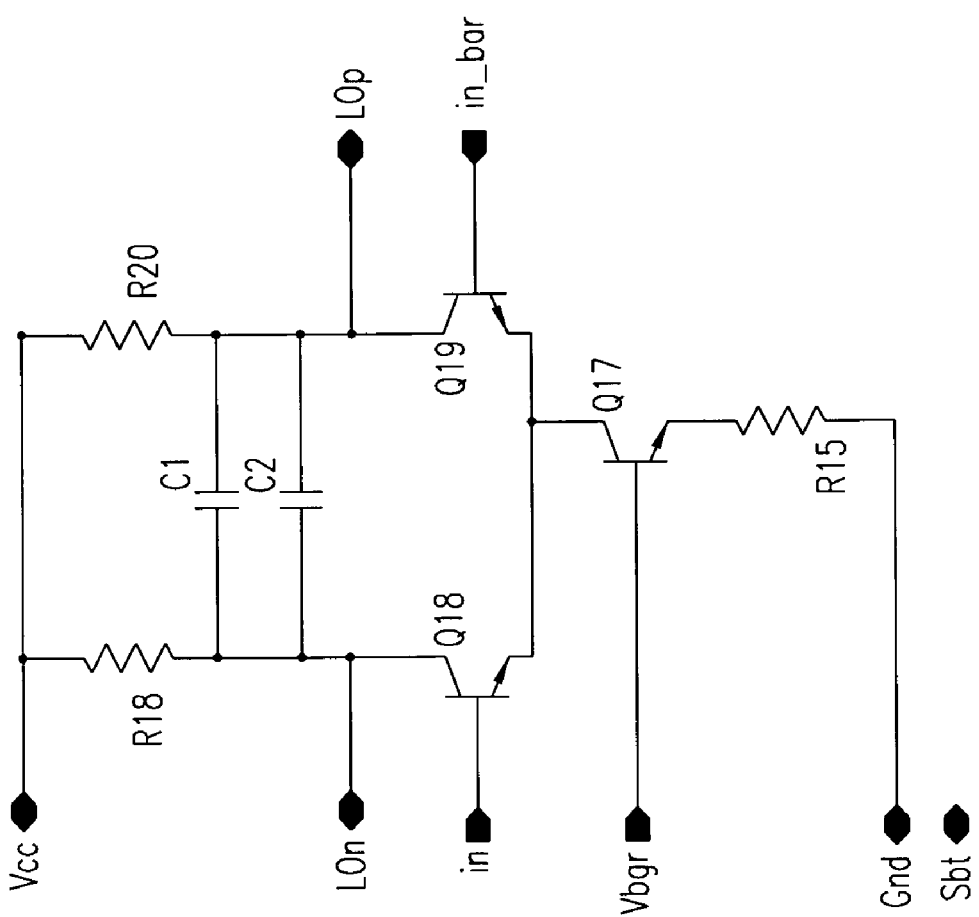
FIG. 12 is a schematic diagram of an exemplary implementation of the limit/delay block shown in FIG. 8.

FIG. 12 illustrates an exemplary implementation of the limit/delay block 804. In this figure, Q18, Q19, R18, and R20 provide the limiter, and the RC combination R18, R20, and C1, C2 provide the delay. The bias point is set by Q17 and R15.

Figure 13:
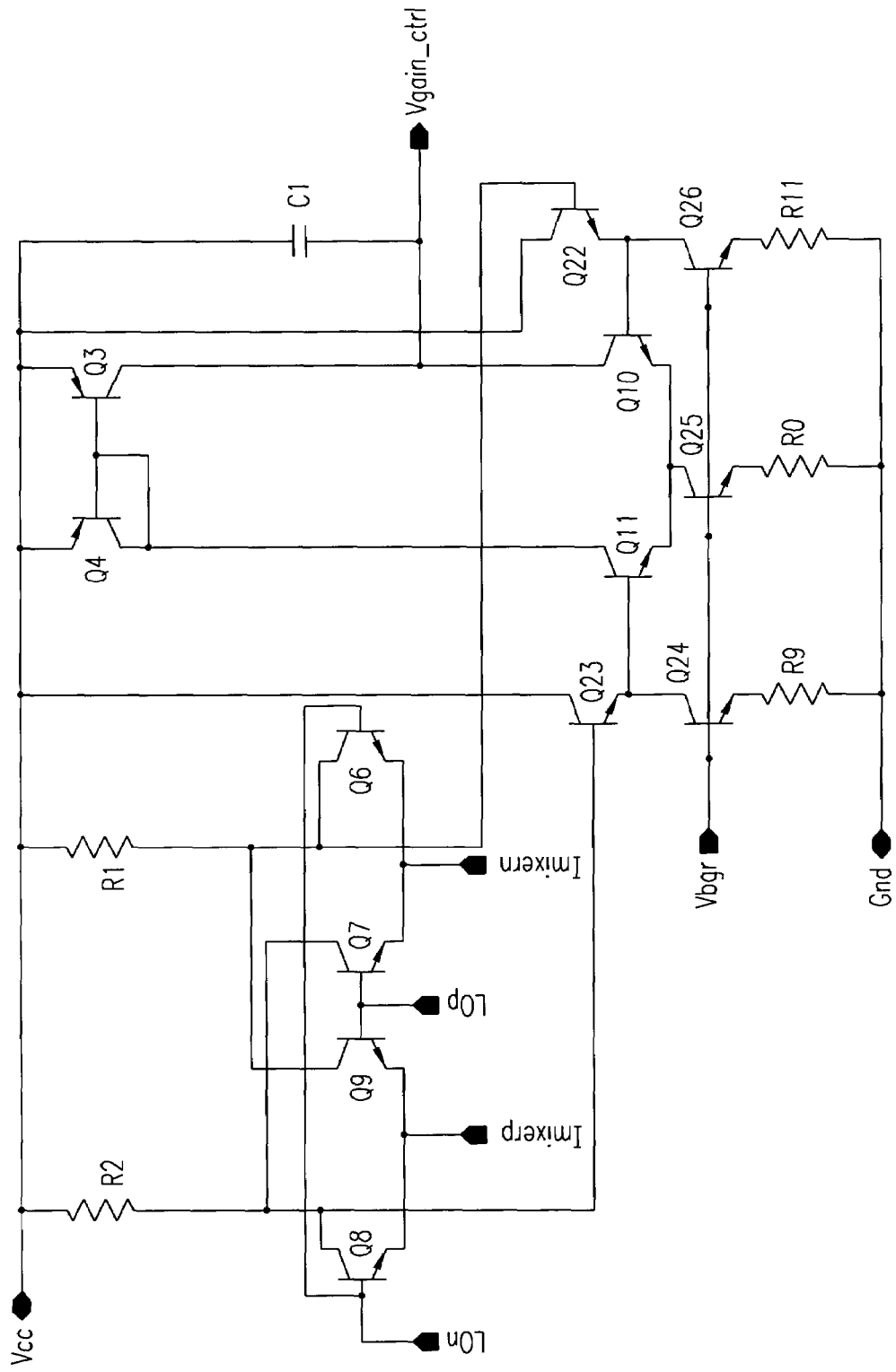
FIG. 13 is a schematic diagram of an exemplary implementation of the mixer shown in FIG. 8.

FIG. 13 illustrates an exemplary implementation of the mixer 806. In this figure, Q6–Q9 provide a standard Gilbert mixer, and R1 and R2 are the mixer load resistors. Q22 and Q23 (DC biased by Q24, Q26 and R9, R11) are used for DC level shifting. The transconductance driving the integrating capacitor C1 is formed by Q3, Q4, Q10, and Q11 (DC biased by Q25 and R0). The voltage across C1 then controls the gain of the frequency path.

Figure 14:
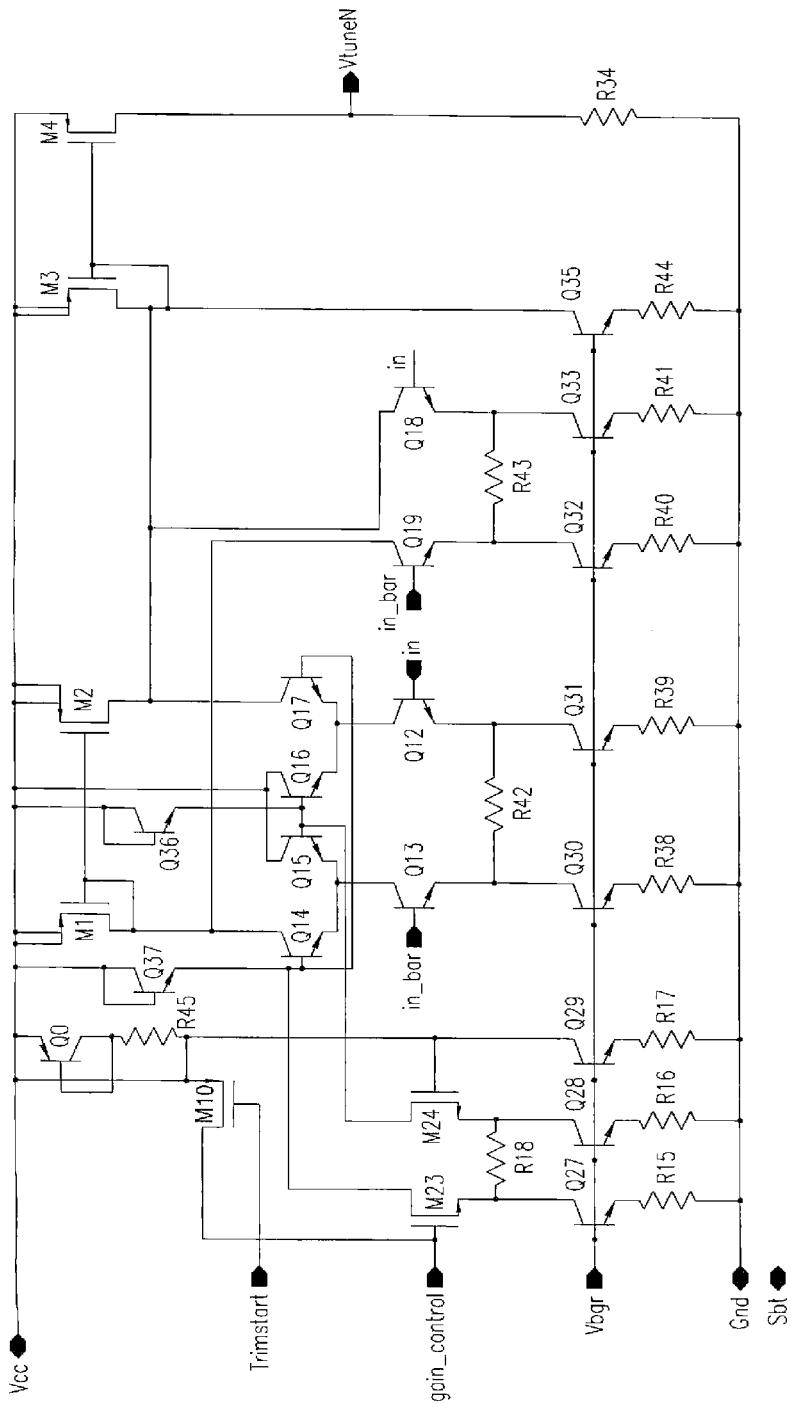
FIG. 14 is a schematic diagram of an exemplary implementation of the variable gain block shown in FIG. 8.

FIG. 14 illustrates an exemplary implementation of the variable gain amplifiers 75 and 175. This block converts the differential frequency signal to a single-ended one that can drive $V_{mod}$ (see FIG. 3). The voltage across resistor R34 modulates $V_{mod}$ of the VCO. Transistors M3 and M4 form a current mirror. Transistor Q35 and resistor R44 are used to set a DC-current/voltage through resistor R34. This allows the frequency input to be negative. Transistors Q18 Q19, M1, and M2 together with resistors R43 form an emitter degenerated transconductance (DC biased by transistors Q32 and Q33 and resistors R40 and R41) that outputs a current to the current mirror formed by transistors M3 and M4. This circuitry forms the fixed gain part.

The variable gain part is formed by another transconductance that is made up of transistors Q12, Q13, M1, and M2 and resistor R42 (DC biased by transistors Q30 and Q31 resistors R38 and R39). To allow gain variations, a Gilbert gain amplifier is formed with transistors Q14–Q17, Q36 and Q37. The Gilbert gain amplifier is current controlled using the transconductance formed by transistors M23 and M24 and resistor R18 (DC-biased by transistors Q27 and Q28 and resistors R15 and R16).

The gate DC level of transistor M24 is set by transistor Q29 and resistor R17, R45 and transistor Q0. Prior to the Trimstart signal (i.e., during PLL locking), the variable gain part is set to half the maximum value using the MOS switch M10. This allows the gain to vary symmetrically downward and upward after the Trimstart signal is issued.

Embodiments of the invention have been described above with reference to the two modulation points, at the VCO and the frequency divider input. The invention, however, may be equally applied to any two-point modulator which has one low pass path and one high pass path. For instance, the low pass path may be supplied through the PLL reference signal.

While particular embodiments and applications of the present invention have been illustrated and described, it is to be understood that the invention is not limited to the precise construction and compositions disclosed herein and that various modifications, changes, and variations may be apparent from the foregoing descriptions without departing from the spirit and scope of the invention as defined in the appended claims.

What is claimed is:

1. A phase modulator, comprising:
a phase-locked loop having a phase frequency detector, a low-pass modulation input coupled to the phase frequency detector, a voltage controlled oscillator, and a high-pass modulation input coupled to the voltage controlled oscillator; and
a trimming circuit connected between the phase frequency detector and the voltage controlled oscillator, the trimming circuit configured to receive an error signal generated by the phase frequency detector and to control a gain of the high-pass modulation input such that the high-pass modulation input and the low-pass modulation input together form an all-pass modulation input to the voltage controlled oscillator;
wherein the trimming circuit forms a feedback control loop together with the phase-locked loop to automatically calibrate gain estimation and variation of the voltage controlled oscillator.

2. A phase modulator, comprising:
a phase-locked loop having a phase frequency detector, a low-pass modulation input coupled to the phase frequency detector, a loop filter, a voltage controlled oscillator, and a high-pass modulation input coupled to the voltage controlled oscillator; and
a trimming circuit connected between the phase frequency detector and the voltage controlled oscillator, the trimming circuit including a filter configured to control a dynamic behavior of the trimming circuit, wherein the trimming circuit is configured to receive an error signal generated by the phase frequency detector and to control a gain of the high-pass modulation input such that the high-pass modulation input and the low-pass modulation input together form an all-pass modulation input to the voltage controlled oscillator.

3. A phase modulator, comprising:
a phase-locked loop having a phase frequency detector, a low-pass modulation input coupled to the phase frequency detector, a voltage controlled oscillator, a high-pass modulation input coupled to the voltage controlled oscillator, and a variable amplifier coupled to the voltage controlled oscillator for introducing an estimation of the gain of the voltage controlled oscillator to the voltage controlled oscillator based upon a center frequency of a desired output signal of the voltage controlled oscillator; and
a trimming circuit connected between the phase frequency detector and the voltage controlled oscillator, the trimming circuit configured to receive an error signal from the phase frequency detector and to control a gain of the high-pass modulation input such that the high-pass modulation input and the low-pass modulation input together form an all-pass modulation input to the voltage controlled oscillator.

4. A phase modulator, comprising:
a phase-locked loop having a phase frequency detector, a low-pass modulation input coupled to the phase frequency detector, a voltage controlled oscillator, and a high-pass modulation input coupled to the voltage controlled oscillator; and
a trimming circuit connected between the phase frequency detector and the voltage controlled oscillator, the trimming circuit configured to receive an error signal from the phase frequency detector and to control a gain of the high-pass modulation input such that the high-pass modulation input and the low-pass modulation input together form an all-pass modulation input to the voltage controlled oscillator, wherein the trimming circuit comprises:
a loop voltage amplifier configured to amplify the error signal upon receipt of a start signal;
a delay and limit section configured to delay and limit a modulation signal provided to the high-pass modulation input;
a mixer configured to mix the amplified error signal with the delayed and limited modulation signal; and
an integrator configured to integrate the mixed signal, wherein the integrated mixed signal is used to control a gain of the modulation signal provided to the high-pass modulation input.

5. A method of automatically calibrating gain estimation and variation of a voltage controlled oscillator in a phase modulator having a phase-locked loop that includes a phase frequency detector, a loop filter, a low-pass modulation input coupled to the phase frequency detector, a voltage controlled oscillator, a high-pass modulation input coupled to the voltage controlled oscillator, and a trimming circuit, wherein the trimming circuit forms a feedback control loop together with the phase-locked loop, said method, comprising:
receiving an error signal generated by the phase frequency detector in the trimming circuit;
filtering the received error signal to control a dynamic behavior of the trimming circuit; and
controlling a gain of the high-pass modulation input using the trimming circuit and the error signal such that the high-pass modulation input and the low-pass modulation input together form an all-pass modulation input to the voltage controlled oscillator.

6. The phase modulator of claim 1, wherein the trimming circuit is configured to apply an estimate of the gain of the voltage controlled oscillator to the voltage controlled oscillator.

7. The phase modulator of claim 1, wherein the phase frequency detector comprises a first charge pump and a second charge pump, and the error signal comprises a feedback component from the first charge pump and a gain control component from the second charge pump.

8. The phase modulator of claim 2, wherein the input of the trimming circuit is connected to the input of the loop filter.

9. The phase modulator of claim 2, wherein the input of the trimming circuit is connected to the output of the loop filter.

10. The phase modulator of claim 3, wherein the voltage controlled oscillator has a separate modulation input for receiving an output of the variable amplifier.

11. The phase modulator of claim 4, wherein loop voltage amplifier includes a low-pass filter configured to filter the error signal and a differential amplifier configured to amplify the filtered error signal.

12. The phase modulator of claim 11, wherein the loop voltage amplifier further includes a transconductance cell in a feedback path of the differential amplifier, and wherein switching a transconductance of the transconductance cell between a high value and a low value transforms the differential amplifier into a bandpass amplifier.

13. The phase modulator of claim 1, wherein the phase modulator is configured to be used in an Enhanced Data GSM Environment communication system.

14. The phase modulator of claim 1, wherein the phase modulator is configured to be used in a Wideband Code Division Multiple Access communication system.

15. The method of claim 5, further comprising applying an estimate of the gain of the voltage controlled oscillator to the voltage controlled oscillator via the trimming circuit.

16. The method of claim 5, wherein the trimming circuit receives the error signal from the phase detector before the loop filter.

17. The method of claim 5, wherein the trimming circuit receives the error signal after the loop filter.

18. The method of claim 5, further comprising introducing an estimation of the gain of the voltage controlled oscillator to the voltage controlled oscillator based upon a center frequency of a desired output signal of the voltage controlled oscillator.

19. The method of claim 18, wherein the voltage controlled oscillator has a separate modulation input for receiving the estimation of the gain of the voltage controlled oscillator.

20. The method of claim 5, further comprising combining the low-pass modulation input and the high-pass modulation input.

21. The method of claim 5, wherein the step of controlling the gain of the high-pass modulation input comprises:
   amplifying the error signal upon receipt of a start signal;
   delaying and limiting a modulation signal provided to the high-pass modulation input;
   mixing the amplified error signal with the delayed and limited modulation signal; and
   integrating the mixed signal, wherein the integrated mixed signal is used to control a gain of the modulation signal provided to the high-pass modulation input.

22. The method of claim 21, wherein the step of amplifying the error signal includes low-pass filtering the error signal and differentially amplifying the error signal.

23. The method of claim 22, the step of amplifying the error signal further includes transforming the error signal into a bandpass signal.

24. The method of claim 5, wherein the method is used in an Enhanced Data GSM Environment communication system.

25. The method of claim 5, wherein the method is used in a Wideband Code Division Multiple Access communication system.

* * * * *

UNITED STATES PATENT AND TRADEMARK OFFICE
CERTIFICATE OF CORRECTION

PATENT NO. : 7,053,727 B2  Page 1 of 1
APPLICATION NO. : 10/661902
DATED : May 30, 2006
INVENTOR(S) : Nilsson It is certified that error appears in the above-identified patent and that said Letters Patent is hereby corrected as shown below:

Title Pg, Item (58), under "Field of Classification Search", in Column 1, Line 1, delete "330/1 A" and insert -- 331/1 A --, therefor.

Title Pg, Item (58), under "Field of Classification Search", in Column 1, Line 2, delete "330/8" and insert -- 331/8 --, therefor.

In the Drawings in Fig. 5, Sheet 3 of 11, delete Tag " ] " and insert -- 10 --, therefor.

In Column 8, Lines 25-26, delete "60 Hz" and insert -- 60 kHz --, therefor.

Signed and Sealed this

Second Day of September, 2008

JON W. DUDAS
*Director of the United States Patent and Trademark Office*